United States Patent [19]

Geissberger et al.

[11] Patent Number: 4,962,050
[45] Date of Patent: Oct. 9, 1990

[54] GAAS FET MANUFACTURING PROCESS EMPLOYING CHANNEL CONFINING LAYERS

[75] Inventors: Arthur E. Geissberger; Robert A. Sadler; Gregory E. Menk; Matthew L. Balzan, all of Roanoke, Va.

[73] Assignee: ITT Corporation, New York, N.Y.

[21] Appl. No.: 280,780

[22] Filed: Dec. 6, 1988

[51] Int. Cl.5 .................... H01L 21/265; H01L 21/44
[52] U.S. Cl. .............................. 437/22; 148/DIG. 15;
148/DIG. 84; 148/DIG. 105; 148/DIG. 141;
357/23.2; 357/15; 437/26; 437/29; 437/39;
437/176; 437/912
[58] Field of Search ................... 148/DIG. 15, 23, 56,
148/65, 72, 76, 82, 84, 102, 105, 106, 110, 111,
141, 169; 357/16, 23.2, 23.15, 23.12, 1; 437/22,
26, 39, 29, 28, 40, 41, 44, 81, 107, 176, 184, 192,
912, 948

[56] References Cited

U.S. PATENT DOCUMENTS 4,593,301 6/1986 Inata et al. .............................. 357/16
4,605,945 8/1986 Katayama et al. ..................... 357/16
4,727,403 2/1988 Hida et al. .............................. 357/16
4,792,531 12/1988 Kakihana ............................... 437/41
4,806,998 2/1989 Vinter et al. ........................... 357/16

OTHER PUBLICATIONS

Geissberger et al., "Refractory Self-Aligned Gate Process . . . ", IEEE International Microwave Symposium Digest, 1987-MTT-S, pp. 665-668.

Primary Examiner—Brian E. Hearn
Assistant Examiner—William Bunch
Attorney, Agent, or Firm—Thomas N. Twomey

[57] ABSTRACT

A high speed GaAs FET is provided by forming a sandwiched GaAs channel between AlGaAs layers and employing an Si implant to provide channel doping for the GaAs channel. The poor activation efficiency of Si in AlGaAs relative to its activation efficiency in GaAs provides a channel having a higher active dopant concentration than exists in the adjacent sandwiching layers. This tends to enhance conductivity in the channel relative to the sandwiching layers.

3 Claims, 3 Drawing Sheets

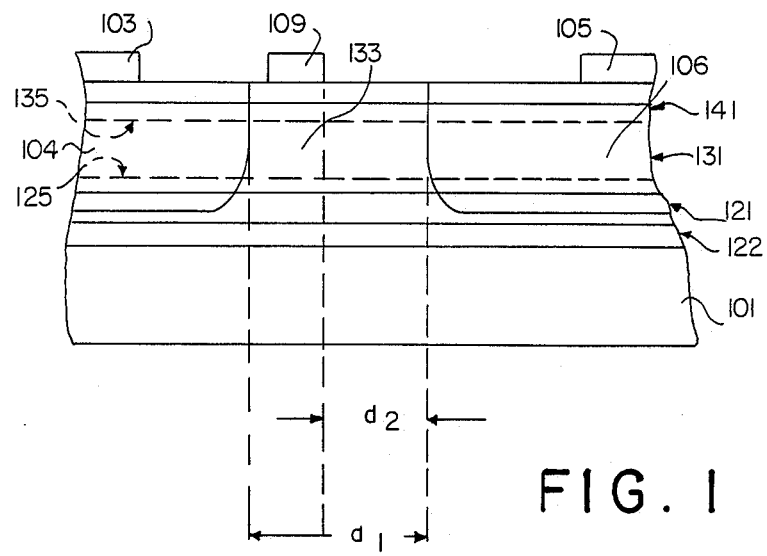
FIG. 1
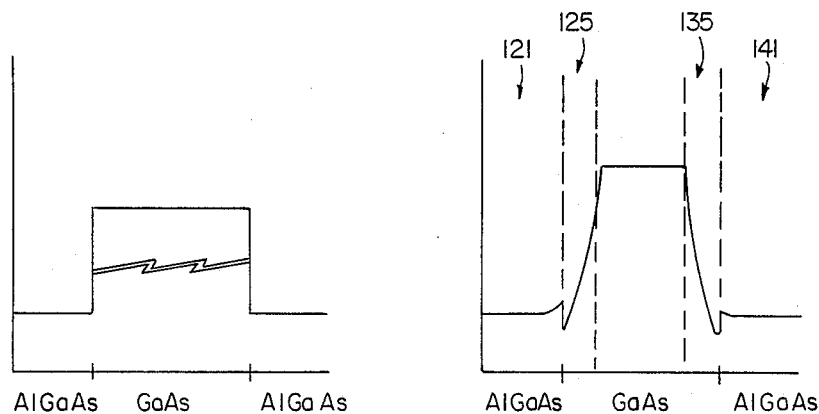
FIG. 2A
FIG. 2B

GAAS FET MANUFACTURING PROCESS EMPLOYING CHANNEL CONFINING LAYERS

FIELD OF THE INVENTION

The present invention relates to an improved GaAs semiconductor device and its manufacture. More particularly, the invention relates to a GaAs field effect transistor having a heterojunction isolated gate (HIGFET) and its fabrication through the use of self aligned source and drain implants.

BACKGROUND AND SUMMARY

In the manufacture of GaAs FET's intended for use as power FET's at high frequencies, problems are encountered, generally in one or more of device breakdown, insufficient transconductance, substrate leakage, and short channel effect. Additionally, operational failures and/or limitations are encountered as a result of excessive capacitance, excessive source resistance, and insufficient current carrying capacity.

Prior efforts to overcome these difficulties have recognized that parasitic substrate current is a significant factor in high frequency applications, "Substrate Current in GaAs MESFET's", L.F. Eastman and M.S. Shur, IEEE Transactions on Electron Devices, Vol. ED-26, No. 9, September 1979, pp. 1359–61. This publication mentions the use of undoped $Al_xGa_{1-x}As$ buffer layers in order to utilize the heterojunction barrier and reduced saturation velocity to provide reduced parasitic conduction.

Kim et al, "Microwave Power GaAs MISFET's with Undoped AlGaAs as An Insulator", IEEE Electron Device Letters, Vol. EDL-5, No. 11, November 1984, pp. 494–495, describes the output power limitations of a MESFET as being related to the gate-drain breakdown voltage and the conduction current through the channel. Use of an insulating or semi-insulating buffer layer is described to increase breakdown while maintaining the channel current level. This can be done in spite of the inverse relation between breakdown voltage and the product of doping level times active layer thickness. It is noted, however, that this approach was not satisfactory and that a HIGFET approach was attempted and rejected due to very low current levels and high parasitic resistances. Finally, a MISFET approach is described wherein an undoped $Al_xGa_{1-x}As$ layer is provided over a highly doped GaAs channel. The layers were formed by molecular beam epitaxy (MBE).

Inomata et al, "Improved Transconductance of AlGaAs/GaAs Heterostructure FET with Si-Doped Channel", Japanese Journal of Applied Physics, Vol. 25, No. 9, September 1986, pp. L731–L733 describes HEMT using AlGaAs/GaAs heterostructure and their limitations due to high source resistance. Provision of a doped AlGaAs layer over doped and undoped GaAs channel layers was studied.

Hida et al, "A High-Current Drivability i-AlGaAs/n-GaAs Doped-Channel MIS-Like FET (DMT)", IEEE Electron Device Letters, Vol. EDL-7, No. 11, November 1986, pp. 625–626 describes the problems facing those designing GaAs devices for high speed, high power applications. Among the problems are the need for high current handling capability with large average transconductance for large input signal, high breakdown voltage, good current linearity and high cut-off frequency. It is noted that MESFET's and two dimensional electron gas FET's (2 DEG FET's or HEMT's) cannot adequately meet these objectives. MESFET's are limited because channel electron density cannot exceed donor density and the high field at the gate lowers the breakdown voltage. 2 DEG FET's have low carrier density (about $10^{12} cm^{-2}$) resulting in parallel conduction in the n-AlGaAs layer leading to transconductance compression. Additionally, 2 DEG FET's have low breakdown because of the doped channel layer under the gate. These problems were addressed by employing an undoped AlGaAs layer over the doped GaAs channel to provide high carrier density in the GaAs channel and high breakdown due to the undoped AlGaAs adjacent the gate. The layers were all grown by MBE.

Notwithstanding these various attempts to provide GaAs FET's suitable for use as high frequency power FET's, there is a continuing desire to obtain higher power at given high frequencies. In addition to the desire to extend the operating limits of power FET's, it is of significant interest to find an economical and repeatable process for their manufacture. Existing processing techniques rely on MBE for the growth of the various doped layers of high frequency power FET's, including growth of such layers as the doped AlGaAs (HEMT) and doped GaAs (DMT) layers. It has been found that individual devices may be fabricated in a laboratory through such a process but that full scale production using such a process is neither economical nor repeatable.

It is therefore an object of the present invention to provide an improved FET suitable for high-frequency, high-power applications.

It is another object of the present invention to provide a manufacturing process which is repeatable and economical and which provides high frequency power FET's.

These and other objects of the invention are obtained through the provision of a first carrier confining layer below the channel layer with or without a second carrier confining layer above the channel layer, combined with a self aligned gate process. Manufacturability is achieved by abandoning the fabrication of doped layers in favor of fabricating undoped layers with subsequent doping. According to a preferred manner of making the improved FET's, a layer of undoped AlGaAs is formed over a substrate by MBE. Undoped layers of GaAs and AlGaAs are sequentially grown, followed by ion implantation, into the GaAs, of a channel dopant, preferably silicon. Due to the poor activation efficiency of silicon into AlGaAs, the AlGaAs layers are not effectively doped. Thus, due to the thin channel layer and the carrier confinement caused by the AlGaAs sandwiching of the channel, a highly doped channel with high carrier concentration is provided. Also, carrier injection into the substrate is avoided and a high breakdown immunity is obtained. The present invention provides an improved FET design and a production-worthy process for its manufacture.

BRIEF DESCRIPTION OF THE DRAWINGS

FIG. 1 is a cross-section of a high frequency power FET according to the invention.

FIG. 2 is a chart showing impurity activation and majority carrier concentration in the power FET illustrated in FIG. 1.

DETAILED DESCRIPTION OF THE INVENTION

Figure 3A:
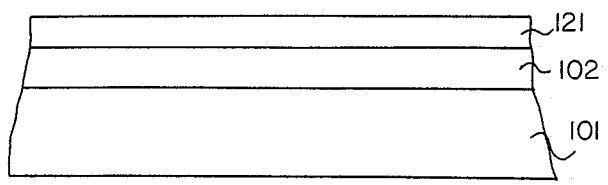
FIG. 3 illustrates a process sequence in accordance with a preferred manufacturing process.
Figure 3B:
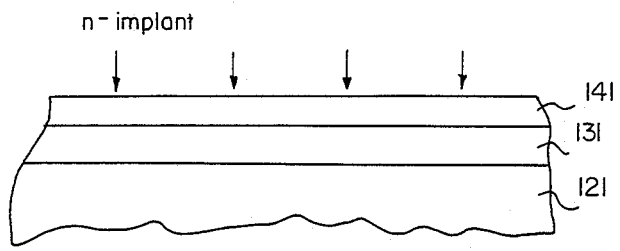

FIG. 1 shows substrate 101 having first AlGaAs layer 121, GaAs layer 131 and second AlGaAs layer 141 over the substrate. Source contact 103 is situated over implanted source region 104 while drain contact 105 is situated over implanted drain region 106. Gate 109 is over AlGaAs layer 141 and situated between the implanted source and implanted drain regions 104, 106. Each of layers 121, 131, 141 is crystalline and channel region 133 of GaAs layer 131 is doped and activated for service as a channel. The activated dopant level in layers 121, 141 is lower than the activated dopant level in channel region 133 by at least an order of magnitude. FIG. $2_a$ illustrates the activated dopant profile in the structure of FIG. 1.

Due to the band gap difference between the AlGaAs 141 and GaAs 131, there is a layer to layer interface, layer 135 having a reduced concentration of majority carriers. This interface layer is established as a result of Schottky-like action where the higher band gap AlGaAs contacts the GaAs. Another layer to layer interface 125 is formed where GaAs layer 131 contacts AlGaAs layer 121. FIG. 2b illustrates the carrier concentration.

In operation, the carrier-free layers 135,125 confine majority carriers to the middle portion of the thickness of GaAs layer 131. One consequence of this carrier confinement is a reduction in carrier injection into the substrate, thus decreasing parasitic resistance and short channel effects. Another consequence of the carrier confinement is a decreased thickness of the effective channel. As a result, higher switching speeds are achievable. The top AlGaAs layer 141 is semi-insulating and suitable for maintaining high electric fields without breakdown. As a result, the breakdown voltage of the FET of FIG. 1 is substantially higher than the breakdown would be without the AlGaAs layer 141. The gate to drain implant spacing $d_2$ is selected in light of the improved breakdown resistance of the AlGaAs layer to obtain the smallest spacing consistent with the required breakdown immunity. In a preferred implementation where the dopant concentration is at least $1E17cm^{-3}$ and the desired breakdown is at least 35V, the spacing can be made less than 1 μm.

Another feature of the invention is the selfaligned N+ source implant region 104. The self alignment of the source implant with the gate results in low source resistance. This also aids in obtaining increased switching speeds. The source to drain separation $d_1$ is minimized for any given gate length and gate to drain separation $d_2$.

As can be seen, the advantages of the various prior approaches as well as some additional performance improvements have been secured through use of the present invention. The FET of FIG. 1 provides breakdown immunity through the provision of layer 141. Additional breakdown immunity is provided by separating the drain implant 106 from the gate. Thus, for a given FET size, higher breakdown is achieved than previously disclosed due to layer 141 and the gate to drain implant spacing $d_2$. This higher breakdown is obtained without the need to reduce channel doping. The maintenance of high channel doping aids in keeping transconductance up, as does avoidance of carrier injection into the substrate. Additionally, confinement of the majority carriers to a middle layer of the doped GaAs channel layer provides improved control over turn ON and turn OFF.

Performance of a FET of the type illustrated in FIG. 1 but without the benefit of the top AlGaAs layer 141, where $$G_m = 150 \frac{ms}{mm},$$

and $R_{s=}0.5$ Ω--mm has been demonstrated at 10 GHz at 0.8 w/mm for an 0.8 micrometer gate length having a gate width of 1.25 mm. At this power level the FET demonstrated a maximum power-added efficiency of 50% and an associated gain of 6dB. This excellent performance was made possible by the AlGaAs buffer layer and the precursor layers 122a-122d shown in FIG. 4.

Figure 4:
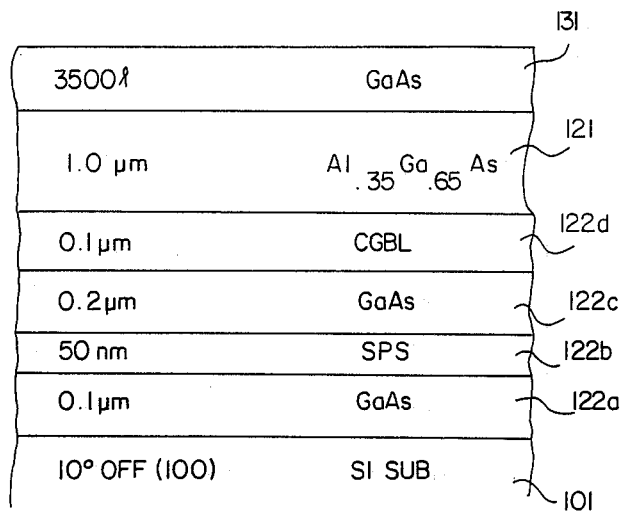
FIG. 4 is a cross-section of a power FET heterostructure according to one aspect of the invention.

The heterostructure illustrated in FIG. 4 is particularly suited for use in power FET fabrication. Semi-insulating (100) GaAs substrate 101 is misoriented 10 degrees towards (111)A (Ga Plane). Successive layers 122a-122d are grown by MBE on the substrate. Layer 122a of GaAs is about 100 nm thick and serves as a buffer. Layer 122b is a 10 period AlAs/GaAs superlattice. Layer 122c is another GaAs layer having a thickness of about 200 nm. Layer 122d is a compositionally-graded buffer layer (CGBL) in which the mole fraction of AlAs is monotonically increased from 0.1 to 0.35 over its 100 nm thickness. Layer 121 is a 1 μm 35% AlGaAs buffer for carrier confinement, and layer 131 is a 350 nm (200 nm) GaAs buffer to serve as the carrier channel medium. None of the above layers were intentionally doped.

The AlAs mole fraction of between approximately 30% to 50% and preferably about 35% was chosen to maximize the conduction band offset between the confinement layer and the channel. It has been found that optimum operation is achieved with an AlAs mole fraction of about 35% to 37% instead of the 47%-50% previously identified, for instance, in U.S. Pat. Nos. 3,901,745 and 4,608,586. Employing an AlAs mole fraction of 35% provides a substantial improvement relative to the operation achieved at the previously suggested 47%-50% mole fraction. During fabrication, a 60 second "stopgrowth" interval may be included after finishing growth of the AlGaAs layer and before initiating growth of the GaAs layer both to change the substrate temperature from conditions suitable for AlGaAs growth (about 660° C.) to those suitable for GaAs growth (about 630° C.) and to allow smoothing of the top of the AlGaAs layer and to create a very abrupt interlayer boundary or interface.

Manufacture of a FET according to the invention commences with a semi-insulating substrate of GaAs 101. Optional precursor layers 122, shown in FIG. 1 of, for instance, undoped epitaxial GaAs, a short period superlattice of GaAs and AlAs, and a compositionally graded buffer layer may be provided on the substrate followed by provision of AlGaAs layer 121, also an epitaxial layer. The precursor layers facilitate the growth of the AlGaAs buffer and prevent contamination of the buffer by diffusion of impurities from the substrate. MBE may be employed for formation of epitaxial layers. AlGaAs layer 121 is undoped so as to provide good isolation of overlying layers from the substrate. Next, GaAs layer 131 is provided. Doping of layer 131 may be provided during epitaxial growth or preferably during a later employed ion implantation. In either case, activated dopant concentration in the channel layer 131 is desirably at least $1\times10^{17} cm^{-3}$. Following layer 131 is a second undoped epitaxial AlGaAs layer 141 formed by MBE. FET construction on the composite structure follows. Gate 109 is provided on layer 141, source and drain regions 104,106 are implanted and activated and source and drain contacts 103,105 are provided. Provision of contacts 103,105 and gate 109 may be by any reliable process, although the process described in commonly owned U.S. patent (copending application Ser. No. 137,309 entitled "Self-Aligned Gate FET and Process" and filed Dec. 23, 1987) has been found to be particularly suited to this invention due to its planar processing and convenient self-aligning (or asymmetrically self-aligning) features.

An improved process which is substantially better for a commercial manufacturing situation has been developed. The improved process avoids the wafer-to-wafer and across-the-wafer variations encountered when MBE is employed on a wafer-by-wafer approach.

Referring to FIG. 3a, a GaAs substrate 101 forms the foundation for the process. Any other foundation capable of supporting a GaAs based semiconductor product would be suitable. A silicon substrate (1,1,1) is one such alternative. A buffer 102 for instance of GaAs may be provided by batch mode MBE or by MOCVD. This buffer is preferably kept as thin as possible, consistent with obtaining a substantially defect-free top surface and being thick enough to absorb all of the implanted ions. A thickness of about 10,000 angstroms has been found satisfactory over a GaAs substrate. While no buffer is required, one such as that disclosed in commonly owned U.S. patent (copending application Ser. No. 230,625 entitled "Method of Making SAGFETs on Buffer Layers" and filed Aug. 10, 1988) will provide a good buffer. Next, an undoped epitaxial layer of AlGaAs 121 is provided by batch mode MBE or MOCVD followed by GaAs layer 131 and AlGaAs layer 141, both of which are undoped and preferably intrinsic epitaxial layers provided by MBE or MOCVD. Channel doping, in GaAs layer 131, is provided by ion implantation of Si through AlGaAs layer 141. An implant of Si is desired which will provide channel doping in layer 131 of at least $1\times10^{17} cm^{-3}$. Preferably, the channel doping is on the order of $3\times10^{17} cm^{-3}$. Channel doping at these levels refers to active dopant concentration in that portion of the channel layer 131 which is not so close to a layer boundary as to substantially influence carrier concentrations in an unbiased condition.

The channel implant will create a substantial dopant concentration in both AlGaAs layers 121 and 141. However, due to the substantially lower activation efficiency of silicon in AlGaAs relative to silicon in GaAs, the "active" dopant concentration in the AlGaAs layers will be less than about $1\times10^{16} cm^{-3}$. In the selection of dopant implant and activation parameters, it is preferred to select conditions where the active carrier concentration in the channel is more than 3 times the active carrier concentration in the adjacent layers 121, 141.

Following the channel implant, a gate is provided and a self-aligned source/drain implant is provided. An asymmetrical mask 201, for instance of photoresist, may be provided over the gate prior to the source/drain implant in order to obtain a desired gate to drain spacing $d_2$ while retaining the source to gate implant alignment. As a result of this implant, the source and drain regions 104, 106 have an impurity concentration exceeding that of the channel by a factor of 3 or more, and preferably by at least a factor of 5. Thus, the active carrier concentration in the GaAs layer 131 at the source/drain implant locations is desirably about $1\times10^{18} cm^{-3}$ or more.

Activation of the implanted impurities, both the channel implant and the source/drain implant, may be accomplished in the conventional two-step process where the channel is activated prior to gate formation, followed by source/drain activation following gate formation. However, a novel activation sequence has been found to significantly reduce process complexity. The new activation sequence reduces the number of heating steps required after impurity introduction by combining the activation of source/drain and channel implants with the heating step employed for completing the source/drain and gate contact 301,302,303 formation. The provision of ohmic contacts to the source and drain typically requires heating of the otherwise completed semiconductor product to an alloying temperature of about 385° C. However, the use of higher temperatures compatible with the optimum anneal schedule for obtaining n-type silicon activation in GaAs, as described, for instance, in the above-mentioned U.S. Ser. No. 137,309, may be employed to sinter the contacts if a combination of thin-film materials similar to those described by M. Murakami et al, Appl. Phys. Lett. 51, 664 (1987), hereby incorporated by reference in its entirety, are used. The elimination of the extra alloying heating step provides an incremental improvement in the control over carrier activation.

The encapsulation of the product during the activation anneal, for instance in SiON, which also serves as the field dielectric for metal interconnect isolation may be of conventional make-up and thickness.

The combination of the ion implantation doping profile with the carrier depletion due to the GaAs/AlGaAs buffer interface results in a very linear relationship between $I_{ds}$ and $V_{gs}$. The linearity of $I_{ds}$ vs. $V_{gs}$ is important, especially for Class B amplifier applications as is the current gain when $I_{ds}$ is low, i.e. below 20% $I_{dss}$. When the amplifier is designed for high power-added efficiency, i.e., 50% or more which requires Class B operation, and where X-band and Ku-band operation is needed, the present invention is particularly beneficial. In X-band operation, FETs producing 800 mW/mm width have been consistently obtained as have Ku-Band FETs producing 533 mW/mm, when biased for Class B operation. In both cases, 50% PAE was achieved. Class B gain has consistently exceeded 6 dB with total output power of 1 Watt at 10 GHz and 0.16 Watt at 18 GHz. For Class B operation, the FETs were biased at $I_{ds}$32 5% $I_{dss}$. Nearly ideal linearity is provided by the invention for $V_{gs}$ from $-0.25$ to $-1.0V$, an accomplishment not previously attained.

Figure 3C:
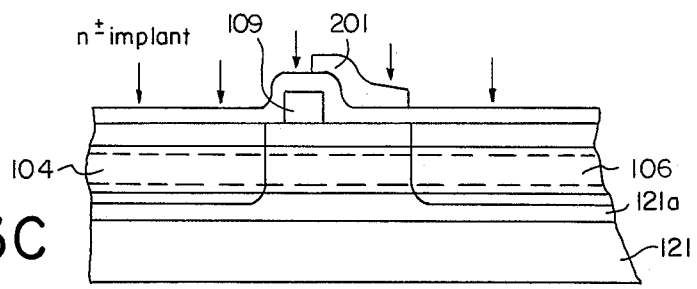
Figure 3D:
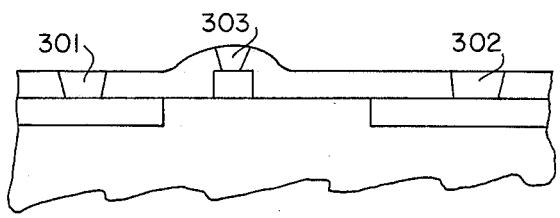

A further improvement can be obtained if the manufacturing process employs the growth of layers 121, 131 including any desired impurities so as to establish doped layers during growth. Following the MBE or MOCVD provision of layer 121 to thickness of between about 0.5 to 1.0 μm and having a Si concentration of between about $5\times10^{15} cm^{-3}$ to $5\times10^{17} cm^{-3}$, and preferably about $5\times10^{16} cm^{-3}$, and undoped and preferably intrinsic AlGaAs layer 121a (FIG. 3c) about 50Å–200Å thick (preferably about 50Å) is provided. Then, GaAs layer 131, between about 200 to 4500 angstroms thick and doped to between about $1\times10^{17} cm^{-3}$ to $1\times10^{18} cm^{-3}$, and preferably about $1.5 \times 10^{17} \text{cm}^{-3}$, Si, is grown over layer 121a. This additional layer improves switching speeds. As the channel approaches pinch-off, there is a very high sheet carrier density at the AlGaAs/GaAs interface. The provision of the undoped AlGaAs layer 121a aids in preventing the conductivity curve from tailing off as the FET approaches pinch-off. This facilitates a more abrupt turn OFF of the FET and thus, higher switching speed.

Devices made according to the invention have consistently withstood 40 volts without breakdown and have shown $I_{ds}$ of 10 ma./mm $W_g$ while consuming about 0.1 W/mm $W_g$. Typical GaAs FETs have breakdown voltages near 10 volts.

While the invention has been described with respect to the best known manner of its implementation, it is to be understood that the invention may be implemented in any number of alternative manners. Those skilled in the art will readily understand the principle of the invention and will be able to employ this principle in various applications, all of which are within the scope of the invention as described in the appended claims, and their equivalents.

We claim:

1. A reliably repeatable high volume manufacturing process for high speed GaAs FETs comprising:
    providing, by MOCVD, a first undoped layer of AlGaAs on a selected foundation;
    providing, by MOCVD, an undoped layer of GaAs on said first layer of AlGaAs;
    providing, by MOCVD, a second undoped layer of AlGaAs on said layer of GaAs;
    defining a channel region in said layer of GaAs and implanting silicon through said second layer of AlGaAs and into said layer of GaAs;
    providing a TiWN layer over said second layer of AlGaAs;
    forming an etch mask over said TiWN layer, said etch mask defining a gate pattern;
    overetching to provide a gate having a length shorter than the gate length defined by said etch mask;
    implanting silicon through said second AlGaAs layer and into said GaAs layer to form source and drain regions employing said etch mask as an implant masking element to self-align said source region with said gate;
    providing source and drain electrodes by a process sequence including a heating step to sinter said electrodes at a temperature of between about 800° C. and 850° C., said heating step serving to activate said implanted source, drain and channel regions, whereby separate activation anneals for said implanted regions are not required.

2. An improved GaAs FET manufacturing process comprising:
    providing a first intrinsic epitaxial layer of AlGaAs on a GaAs substrate,
    providing an epitaxial layer of GaAs directly on said first intrinsic epitaxial layer of AlGaAs,
    defining a channel region in said epitaxial layer of GaAs,
    providing a second epitaxial layer of AlGaAs directly on said epitaxial layer of GaAs and covering said channel region,
    implanting an n-type determining dopant through said second epitaxial layer of AlGaAs and into said epitaxial layer of GaAs,
    providing a gate over said second epitaxial layer of AlGaAs at said channel region,
    implanting source and drain regions into said epitaxial layer of GaAs, said source region being self aligned with said gate,
    providing source and drain electrodes.

3. An improved GaAs FET manufacturing process comprising:
    providing an epitaxial layer of GaAs on a substrate;
    providing an epitaxial layer of AlGaAs directly on said epitaxial layer of GaAs,
    implanting an n-type determining dopant through said epitaxial layer of AlGaAs and into said epitaxial layer of GaAs to provide channel doping,
    providing a gate over said epitaxial layer of AlGaAs, and
    implanting source and drain regions into said epitaxial layer of GaAs, said source region being self aligned with said gate.

* * * * *